United States Patent [19]
Wheaton

[11] Patent Number: 5,021,856
[45] Date of Patent: Jun. 4, 1991

[54] UNIVERSAL CELL FOR BIPOLAR NPN AND PNP TRANSISTORS AND RESISTIVE ELEMENTS

[75] Inventor: Larry B. Wheaton, Santa Cruz, Calif.

[73] Assignee: Plessey Overseas Limited, England

[21] Appl. No.: 323,269

[22] Filed: Mar. 15, 1989

[51] Int. Cl.$^5$ .......................................... H01L 27/02
[52] U.S. Cl. ........................................ 357/40; 357/43;
357/34; 357/68; 357/46; 357/45; 357/13; 357/51
[58] Field of Search ....................... 357/40, 41, 43, 46, 357/65, 68, 45, 34, 35, 51, 13

[56] References Cited

U.S. PATENT DOCUMENTS

| | | | |
|---|---|---|---|
| 2,663,806 | 12/1953 | Darlington | 307/88 |
| 2,709,232 | 5/1955 | Thedieck | 317/235 |
| 2,735,948 | 2/1956 | Sziklai | 307/88.5 |
| 2,874,232 | 2/1959 | Jochems | 179/171 |
| 2,954,486 | 9/1960 | Doucette et al. | 307/88.5 |
| 3,205,373 | 9/1965 | Hyman et al. | 307/88.5 |
| 3,238,384 | 3/1966 | Lewis | 307/88.5 |
| 3,327,182 | 6/1967 | Kisinko | 317/235 |
| 3,351,775 | 11/1967 | Cook, Jr. et al. | 307/88.5 |
| 3,401,319 | 9/1968 | Watkins | 317/235 |
| 3,524,113 | 8/1970 | Agusta et al. | 317/235 |
| 3,564,443 | 2/1971 | Nagata | 330/38 |
| 3,617,827 | 11/1971 | Schmitz et al. | 317/235 |
| 3,643,231 | 2/1972 | Lohrey et al. | 340/173 FF |
| 3,643,235 | 2/1972 | Berger et al. | 340/173 FF |
| 3,736,477 | 5/1973 | Berger et al. | 317/235 R |
| 3,801,836 | 4/1974 | Castrucci et al. | 307/303 |
| 3,916,218 | 10/1975 | Berger et al. | 307/213 |
| 3,922,565 | 11/1975 | Berger et al. | 307/213 |
| 3,969,747 | 7/1976 | Tsuyuki et al. | 357/44 |
| 4,064,526 | 12/1977 | Tokumara et al. | 357/46 |
| 4,115,711 | 9/1978 | Moussie | 307/350 |
| 4,137,109 | 1/1979 | Aiken et al. | 148/175 |
| 4,140,922 | 2/1979 | Mueller | 307/213 |
| 4,246,500 | 1/1981 | Okada et al. | 307/299 B |
| 4,249,193 | 2/1981 | Balyoz et al. | 357/40 |
| 4,255,209 | 3/1981 | Morcom et al. | 148/175 |
| 4,272,307 | 6/1981 | Mayrand | 148/187 |
| 4,328,509 | 5/1982 | Lehning | 357/36 |
| 4,375,645 | 3/1983 | Funatsu | 357/50 |
| 4,458,158 | 7/1984 | Mayrand | 307/270 |
| 4,649,413 | 3/1987 | Kelly | 357/41 |
| 4,689,657 | 8/1987 | Percival et al. | 357/40 X |
| 4,851,893 | 7/1989 | Giannella | 357/34 X |

FOREIGN PATENT DOCUMENTS 0240273 10/1987 European Pat. Off. .
0243034 10/1987 European Pat. Off. .

OTHER PUBLICATIONS

Exar Advertisement, *Electronic Design*, Oct. 16, 1986, p. 137.

Giannella, "The Flexible Array Technique: A Revolutionary Custom Bipolar Approach Combining the Best of Standard Cell, Analog Arrays and Full Custom," Proceedings of the 6th *Intl. Conf. on custom and Semicustom ICs*, Nov. 4-6, 1986, London, England, pp. 1-49.

(List continued on next page.)

*Primary Examiner*—William Mintel
*Attorney, Agent, or Firm*—Skjerven, Morrill, MacPherson, Franklin and Friel

[57] ABSTRACT

A universal cell, for use in fabricating a custom analog circuit from a standard semiconductor wafer containing a plurality of such cells, includes a semiconductor pocket of a first conductivity type having a surface. At least two regions of second conductivity type opposite to the first conductivity type are formed laterally spaced from each other in the semiconductor pocket. At least one region of the first conductivity type is then formed in one of the at least two regions of second conductivity type. Electrical interconnects are then provided to interconnect one or more of the at least two regions, the pocket of semiconductor material and the at least one region of the first conductivity type to form a selected structure such as an NPN transistor, a PNP transistor, a resistor or a diode. A plurality of identical cells of this type are formed in a semiconductor die and can be selectively interconnected to form any one of a large number of analog circuits.

33 Claims, 11 Drawing Sheets

1= P ISOLATION
2= n⁺ BURIED LAYER
3= P BASE
4= n⁺ EMITTER
5= CONTACT
6= METAL (Al) ALUMINUM

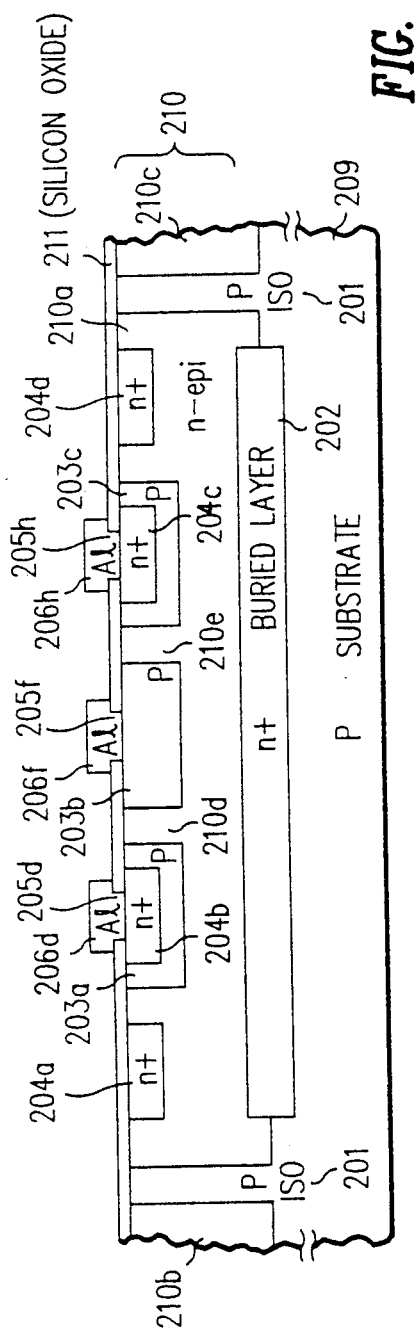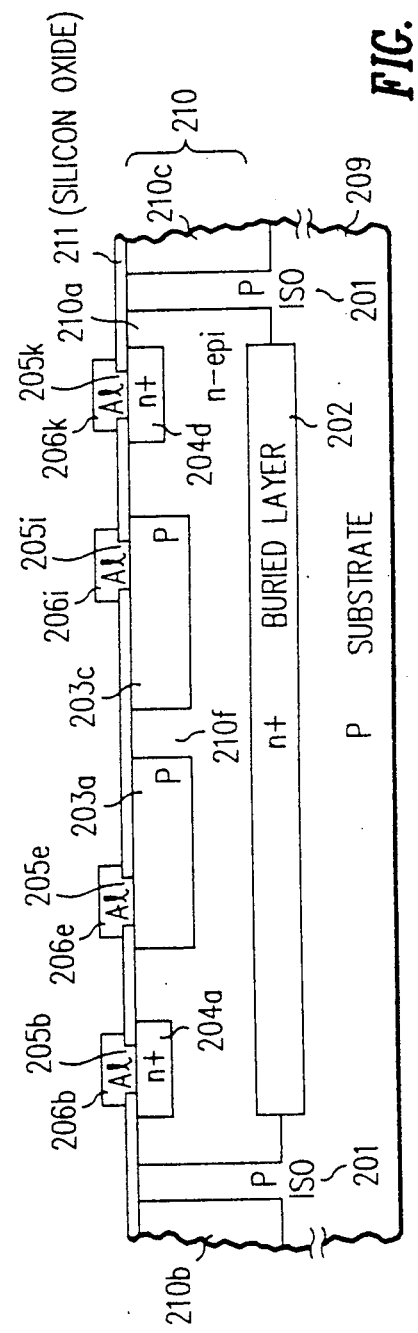

UNIVERSAL CELL FOR BIPOLAR NPN AND PNP TRANSISTORS AND RESISTIVE ELEMENTS

This is a continuation of application Ser. No. 018,654, filed Feb. 25, 1987 now abandoned.

BACKGROUND OF THE INVENTION

1. Field of the Invention

This invention relates to a universal semiconductor cell capable of being configured as an NPN transistor, a PNP transistor, a diode or a resistive element and to integrated circuits using one or more of these universal cells.

2. Description of the Prior Art

Semiconductor products are typically classified as standard products (i.e., products designed for general application and available off the shelf from distributors or manufacturers) and custom products (i.e., products uniquely designed for a particular application and customer and available only to that customer). However, a class of intermediate-type products using a standard silicon substrate manufactured in large volume but capable of being configured to suit the particular needs of a customer has been developed to give some of the advantages of high volume production to custom products generally used in quantities less than the high volume required for standard products. A typical product of this type is a gate array. A gate array is fabricated by placing on a base array (manufactured in high volume so as to achieve the economies of large volume production) a unique metallization layer configured to meet the needs of the particular customer, thereby to provide a circuit uniquely suitable for a particular application. A gate array is one example of an application specific integrated circuit (sometimes called an "ASIC"). Typically, ASIC's are used in digital logic where the logic circuit is configured to meet a particular customer's needs by changing the metallization pattern or patterns formed on the standard base array.

While ASIC technology has been commonplace in digital logic, to date linear circuits have not been as easy to implement as ASIC's because linear circuits are generally custom designed for their particular applications. While numerous linear circuits are manufactured as standard products, these circuits are still restricted to particular uses contemplated at the time of their design. Accordingly, there is a need for a linear circuit which is capable of being configured for specific uses which can be manufactured as a standard product in large quantities to achieve the economies of large scale production but which is capable of being configured as a custom product for a particular design.

SUMMARY OF THE INVENTION

In accordance with this invention, a cell is provided for use in a linear integrated circuit which can be configured as an NPN transistor, a PNP transistor, a diode and/or a resistive element depending upon the particular requirement of the linear circuit being designed. A plurality of these cells are formed in a semiconductor substrate (typically silicon) and the substrate is then metallized in such a manner as to yield a linear circuit having desired characteristics. Accordingly, in accordance with may invention the economies of mass production can be joined to the advantages of application specific integrated circuits to yield a linear circuit uniquely designed for a particular use.

In accordance with my invention, a cell is provided having a conductivity of one type which contains a region corresponding to a P type collector, another region corresponding to an N type base and a third region corresponding to a P type emitter. Forming separate electrical contacts to these three regions allows these regions to function as a PNP bipolar transistor. Additional regions are provided in the cell to function as a P type base and an N type emitter, respectively. The N type base region of the PNP transistor can function as an N type collector region in an NPN transistor, with the additional regions forming a P type base and an N type emitter.

The P type collector in the PNP bipolar transistor is configured to function as a dual collector structure if desired. However, the dual collector structure can also be used to fabricate a diffused resistor with one collector contact serving as one contact to the resistor and the other collector contact serving as the other contact to the resistor.

The various regions described above are in one embodiment formed in an N type pocket epitaxially grown on a P type semiconductor substrate. A plurality of the cells of this invention are fabricated on a semiconductor substrate to allow a designer to interconnect these cells in such a way to provide a unique linear circuit in accordance with design requirements. The cells of this invention are interconnected selectively to form the desired application specific linear integrated circuit (ASLIC).

An alternative embodiment is provided wherein two elements of the PNP transistor are common to the NPN transistor, thus providing a more efficient arrangement.

This invention will be more fully understood in conjunction with the following detailed description taken together with the attached drawings.

BRIEF DESCRIPTION OF THE DRAWINGS

FIGS. 3a and 3b show two different cross sections of the cell of FIG. 2;

DETAILED DESCRIPTION

The following detailed description is meant to be illustrative only and not limiting. Others skilled in the art will be able to implement other configurations embodying the invention based upon this description.

Figure 1A:
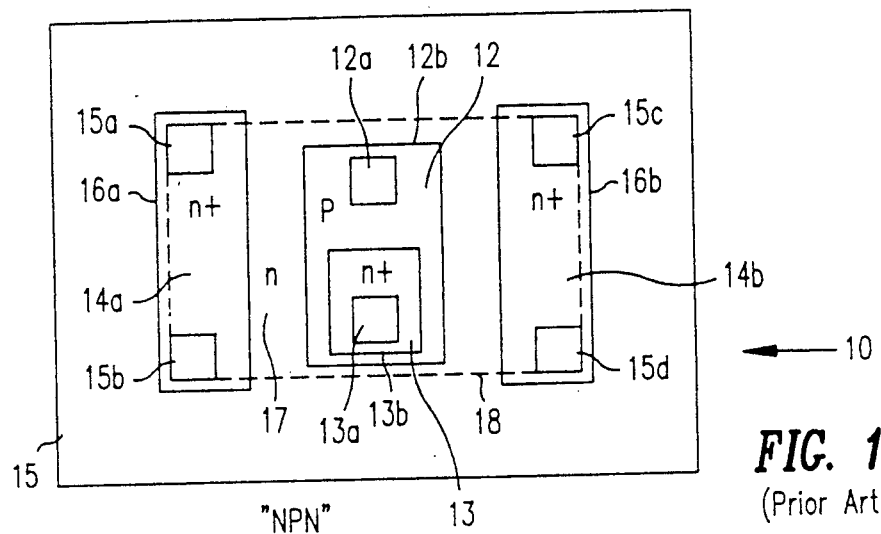
FIGS. 1a, 1b and 1c illustrate a top view of a cell of the prior art containing an NPN transistor, a cell of the prior art containing a PNP transistor and the composite cell of this invention, respectively.

FIG. 1a illustrates in top view the layout of a prior art NPN transistor 10. A pocket 15 of N type conductivity (hereinafter called an "N epitaxial pocket" or an "N epi pocket" or an "N pocket") is obtained by forming in a well-known manner an N epitaxial layer of N type conductivity on a P type semiconductor (typically silicon) substrate. N+ regions 14a, 14b are formed in N pocket 15 by placing additional N type impurity within the regions circumscribed by boundaries 16a and 16b, respectively. N+ regions 14a and 14b serve to contact the buried collector (the lateral extent of which is shown by dashed line 18) of the NPN transistor. Formed within N pocket 15 is N type collector region 17 contacted through contact windows or vias 15a, 15b, 15c and 15d in the insulation (not shown) overlying the structure. Collector region 17 underlies P type base region 12 contact to which is made through contact window or via 12a. Base region 12 is formed by placing a P type impurity such as boron in N type region 17 through diffusion or ion implantation. Boundary 12b delineates the lateral extent of P type base region 12. Formed within P base region 12 is emitter region 13 of N+ type conductivity with emitter contact formed through via 13a by use of a selected metal such as aluminum. Boundary 13b delineates the lateral extent of emitter region 13.

Figure 1B:
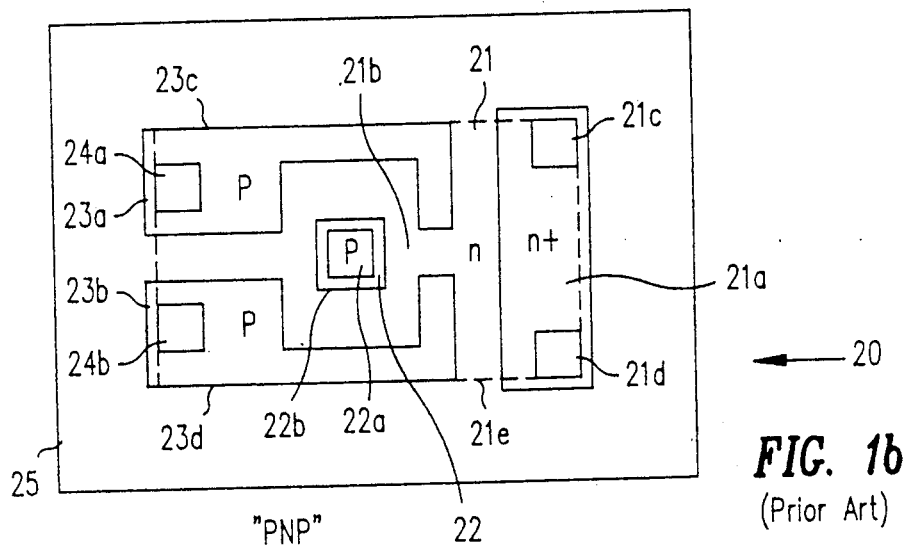

Shown in FIG. 1b is a PNP transistor 20 formed in N epi pocket 25. The N epitaxial pocket 25 has formed therein P type regions 23a and 23b separated (as shown by the boundaries 23c and 23d defining the lateral extent of these P regions) by portion 21b of N type region 21. N type region 21, called an N+ buried layer, is a portion of the N epi pocket 25. The lateral extent of N+ buried layer 21 is defined by boundary 21e. N+ buried layer 21 is formed at the intersection of the P type substrate and the N epitaxial layer in a well-known manner and functions as a conductive layer in the structure of FIG. 1b. Electrical contact to buried layer 21 is made through vias 21c and 21d to region 21a which extends to the surface above the buried layer 21. The vias 24a and 24b allow electrical contact to the collector regions 23a and 23b. Formed in a portion of N type base region 21b is emitter region 22. Emitter region 22 has a lateral boundary 22b. Electrical contact is made to emitter 22 through contact window 22a. The electrical contacts to the collector regions 23a and 23b, emitter region 22 and base region 21 are formed through vias (i.e., openings or contact windows) in an insulation layer formed over the top surface of the semiconductor material in a well-known manner and thus these electrical contacts are not described in detail. Likewise, the insulating material is not shown but is well-known to those skilled in the art. For simplicity, the insulation is not shown in any plan view in the drawings.

Figure 1C:
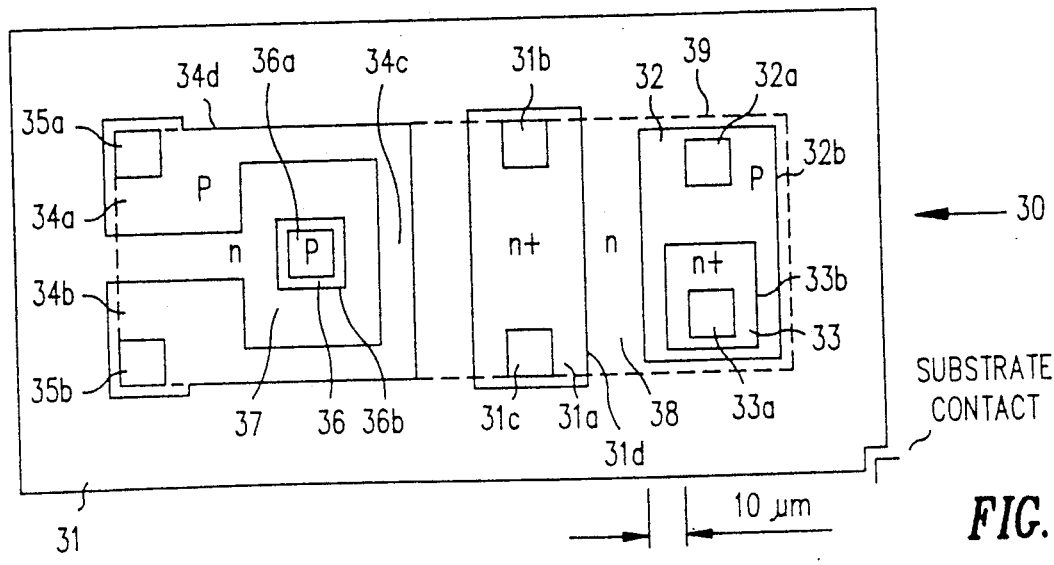

One structure of this invention is shown in FIG. 1c. This structure allows the formation of either an NPN or PNP transistor, a diode or a resistor in the same pocket. As shown in FIG. 1c, a PNP transistor includes collector regions 34a and 34b electrical contact to which is made using vias 35a and 35b formed in a well-known manner through the overlying layer of insulation (typically silicon dioxide) Regions 34a and 34b are connected by region 34c also of P type material. All three P type regions 34a, 34b and 34c are formed in the underlying N epi pocket 31 by ion implantation or diffusion. The N type base region 37 is part of the N pocket 31 and has formed in it a P type emitter 36 the lateral extent of which is defined by boundary 36b. Electrical contact to emitter 36 is made by a conductive material, typically aluminum, formed through a via 36a in the insulation overlying the surface of the structure. Electrical contact to the base region 37 is made through N+ region 31a formed by ion implantation or diffusion. The lateral extent of region 31a is the boundary 31d. Electrical contacts are formed of a conductive material such as aluminum in contact windows 31b and 31c. The PNP lateral transistor comprises collector regions 34a, 34b and 34c, base region 37 and emitter region 36 and is a lateral transistor. An NPN vertical transistor is formed to include N type region 38 (which is an extension of N type region 37 to the right of N+ material 31a). N+ material 31a allows a low resistance contact to be made to the N type material 38. P type base region 32 is formed by diffusion or ion implantation in the N type material 38. P type material 32 has a lateral extent defined by boundary 32b and electrical contact to P type region 32 is made through contact window 32a with conductive material such as aluminum. Formed within P type base region 32 is N type emitter region 33 of N+ conductivity. The lateral extent of emitter region 33 is defined by boundary 33b. Electrical contact to N+ emitter region 33 is made through contact window 33a. Contact windows 32a, 33a are, like the other contact windows shown in FIG. 1c, formed through an overlying insulation layer such as silicon dioxide (not shown) in a well-known manner. Thus, the formation of these contact windows and the placing of conductive metal in these windows will not be described in detail. Should it be desired to form an NPN transistor, the collector contact windows 31b, 31c are metallized during manufacture and separate electrical contacts are made through contact window 32a to the P type base region 32 and through contact window 33a to the N+ type emitter region 33. Thus, a vertical NPN transistor is formed. Should, however, it be desired to form a PNP transistor, electrical contact is made through contact windows 31b and 31c to N type base region 37, and through contact windows 35a and 35b to collector regions 34a and 34b, respectively, and finally through contact window 36a to underlying P type emitter region 36.

The advantage of the structure shown in FIG. 1c is that the structure formed in silicon can be programmed by electrically connecting the proper regions to be either an NPN vertical transistor or a PNP lateral transistor.

Of importance, the contact windows in the cell of FIG. 1c can all be opened by one masking step and then the selected regions interconnected to form the desired element within the cell or, alternatively, a separate mask can be used to open only those contacts which it is desired to use to form the circuit. If this latter option is used, interconnects can be run across unopened contact regions without any harm to the circuit. Using the first option (i.e., opening all interconnects) allows a metal layer to be placed over the top surface of the device and the wafer containing the cells to be stored until it is ready to be programmed by merely selectively etching away the metal to form the desired interconnect pattern. Using the second option (i.e, opening only selected contact windows required to form the desired circuit) requires two custom masks, one to open the selected contact windows and the other to form the desired metallized interconnect pattern. Thus the advantages of mass production are not achieved through the metallization layer as with the first option. The alternative though is greater flexibility in routing interconnects.

Of interest, by using the electrical contacts through vias 35a and 35b as two ends of a circuit, the P type regions 34a, 34b and 34c can also serve as a diffused resistor instead of part of a collector of a PNP lateral transistor.

Figure 2:
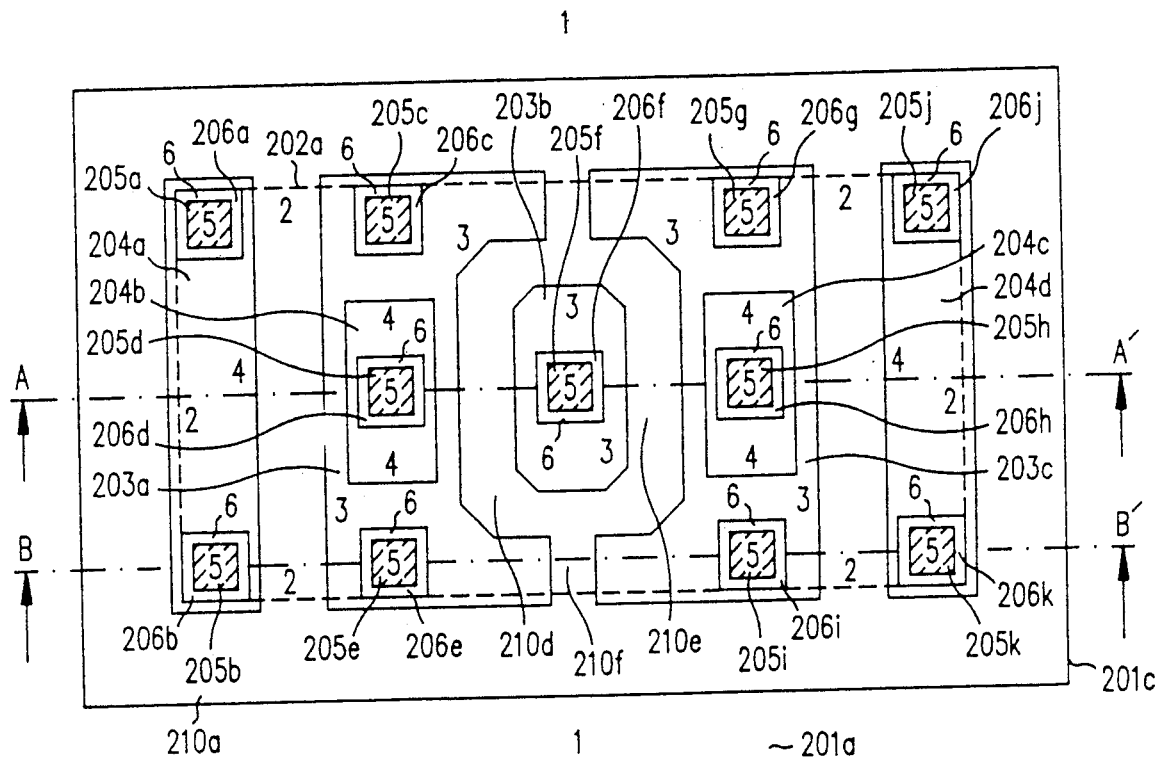
FIG. 2 illustrates in plan view one cell of this invention.

FIG. 2 illustrates in plan view an additional embodiment of this invention. FIGS. 3a and 3b illustrate in cross section parts of the structure illustrated in plan view in FIG. 2.

In FIG. 2, region 201a outside boundary 201c comprises P type material which forms the well-known P type isolation associated with the circuit. Formed inside boundary 201c is an N epitaxial pocket 210a and an N+ buried layer 202 (see FIGS. 3a and 3b) at the interface between the epitaxial layer 210 and a P type substrate 209 (typically silicon). The lateral boundaries of buried layer 202 are denoted by dashed line 202a. Formed above N+ buried layer 202 is a P type region 203 of which portions 203a, 203b and 203c are shown in top view in FIG. 2. The region 203b is separated from regions 203a and 203c by regions 210d and 210e of N type material. Formed in P type region 203a is N+ type region 204b. Formed in P type region 203c is N+ type region 204c. Electrical contact to regions 204b and 204c is made through contact windows 205d and 205h, respectively, by use of metal contacts 206d and 206h, typically aluminum.

P type region 203b is contacted through contact window 205f by metal 206f, typically aluminum.

Electrical contact to P type region 203a is made through contact windows 205c and 205e by conductive material such as metal 206c and 206e, as shown. Electrical contact to P type region 203c is made through contact windows 205g and 205i by conductive metal such as aluminum 206g and 206i.

Electrical contact to N+ region 204d (204a) is made through contact windows 205j (205a) and 205k (205b) by conductive material 206j (206a and 206b).

The cross section AA' taken through the middle of the structure shown in plan view in FIG. 2 is shown in FIG. 3a while the cross section BB' taken through the bottom portion of the structure shown in plan view of FIG. 2 is shown in FIG. 3b. P type isolation 201 is shown in cross section in both FIGS. 3a and 3b. In FIG. 3a, the cross section is shown with a silicon dioxide layer 211 formed on top of an N epitaxial layer 210 which in turn is formed on a P type substrate 209. The P type isolation 201 isolates N epi island 210a from adjacent N epi islands 210b and 210c (of which only portions are shown). The N+ buried layer 202 is shown formed at the boundary between P substrate 209 and N epi 210.

The structure as shown can be interconnected to form among other structures, an NPN vertical transistor or a PNP lateral transistor. The NPN vertical transistor is formed from regions 204b, 203a, and 202 (FIGS. 3a and 3b). Electrical contact to region 202 is made through N+ region 204a or N+ region 204d. Electrical contact to region 204b is made through via 205d with metal contact 206d. As shown in FIGS. 3a and 3b, regions 204a and 204d are not in direct contact with region 202 but are separated therefrom by portions of N epitaxial pocket lying between regions 204a, 204d on the one hand and region 202 on the other hand. Electrical contact to region 203a is made, referring to FIG. 2, through vias 205c and 205e by means of metal contacts 206c and 206e, as explained above in connection with FIG. 2. Electrical contact to N type region 204a is made through vias 205a and 205b by means of contact metal 206a and 206b, also as explained above.

An alternative vertical transistor is formed with emitter region 204c, base region 203c and collector region 202.

A lateral PNP transistor is made from regions 203b, in epitaxial layer 210, and region 203c or alternatively from region 203a. Electrical contact to regions 203b, 203c or 203a is made as described above in conjunction with the plan view of FIG. 2. Contact to the N epi region 210d or 210f is made through N+ regions 204a and 204d in conjunction with buried layer 202. By appropriately electrically connecting selected contacts on the top of the structure, the structure can be formed into a PNP lateral transistor (made up, for example, of P type region 203b, N type region 210d, and P type region 203a or made up, for example, of P type region 203b, N type region 210e and P type region 203c), or an NPN vertical transistor (made up, for example, of emitter regions 204b and/or 204c formed in base regions 203a and 203c in epi material 210 and N+ buried layer 202. Electrical contact to N+ buried layer 202 is made through N+ regions 204a and 204d.

FIG. 3b illustrates in cross section the structure looking in the direction of the arrows associated with BB' in FIG. 2. The structure shows certain of the same regions discussed above in conjunction with FIG. 3a but omitted from FIG. 3b is the cross section of P type region 203b and the via 205f and conductive contact 206f.

Of interest in the structure shown in FIGS. 2, 3a and 3b is that a partially pinched resistor can also be obtained from regions 203a or 203c of this structure. By electrically contacting region 203a at electrical contacts 206e and 206c a pinched resistor is obtained by means of the diffused or ion-implanted material forming P type region 203a. Similarly, by contacting electrical contacts 206i and 206g, a pinched resistor is obtained by the P type material 203c between these two contacts.

Figures 4A, 4B:
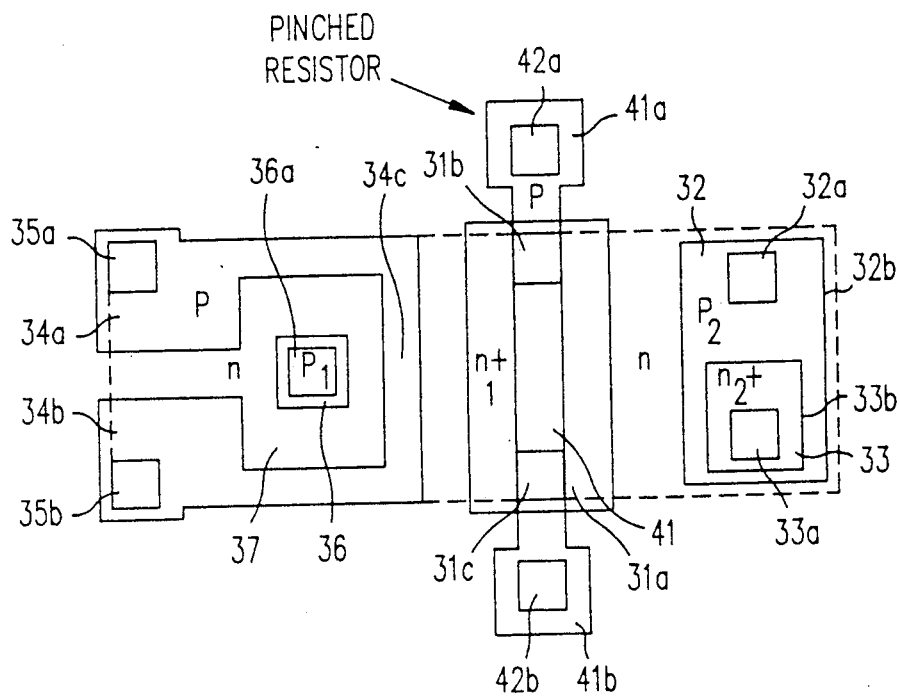
FIGS. 4a and 4b show in plan view alternative cells embodying the principals of this invention.

FIG. 4a illustrates a four-layer silicon control rectifier formed using the structure of this invention disclosed for example in FIG. 1c. In FIG. 4a, the components of the structure shown in plan view are given the same numbers as the same components in FIG. 1c. However, the structure of FIG. 4a has been modified from that shown in FIG. 1c by adding a diffused P region 41 in the midst of N+ type region 31a. The P type conductivity region 41 formed in N+ type region 31a is contacted through the two extended P type regions 41a and 41b to which electrical contact is made through vias 42a and 42b. The contact to P region 41 from contacts 42a and 42b allows region 41 to function as a pinched resistor. P region 41 is formed subsequent to the formation of P region 36 and P region 32.

It should be noted that FIG. 4a functions as a silicon controlled rectifier with regions P1, N1, P2, N2. The P1 region is 36, the N1 region is N+ type conductivity region 31a, the P2 region is P type conductivity region 32, and the N2 region is N+ type conductivity region 33. Contact to each of these regions is made through the contacts shown in FIG. 1c. The silicon controlled rectifier functions in a standard well-known manner.

FIG. 4b illustrates a dual collector lateral PNP transistor, a vertical NPN transistor or alternatively a dual resistor structure which can be formed from the same cell. In FIG. 4b, the dual collector PNP comprises a lateral transistor made up of dual collector regions 45 and 46, N type base region 48 and P type emitter region 47. Collector region 45 is defined by boundary 45c. Collector region 46 is defined by boundary 46c. Contact to collector region 45 is made through contact windows 45a, 45b while contact to collector region 46 is made through contact windows or vias 46a and 46b. Contact to N type base region 48 is made through N+ regions 43 and 44 through contact vias 43a, 43b to N+ region 43 and contact vias 44a, 44b to N+ region 44. The base contact is made from regions 43 and 44 through an underlying buried layer such as buried layer 202 in FIG. 2 which extends into contact with the N type base material 48. Alternatively, N type region 48 can function as the collector of a vertical NPN transistor the base of which is P type region 47 and the emitter of which is N type region 49. The boundary of P type base region 47 is depicted as 47a while the boundary of N type emitter region 49 is shown as 49a. Contact to N type region 49 (of N+ conductivity) is through contact via 49b.

In addition to functioning as a dual collector lateral PNP or a vertical NPN device, the structure of FIG. 4b can also be connected to form two diffused resistors by using region 45 as one of the diffused resistors with electrical contact to the two ends of the diffused resistor being made through contact vias 45a and 45b. The other diffused resistor is made up of region 46 with contact to the two ends of the diffused resistor being made through contact vias 46a and 46b.

Figure 5A:
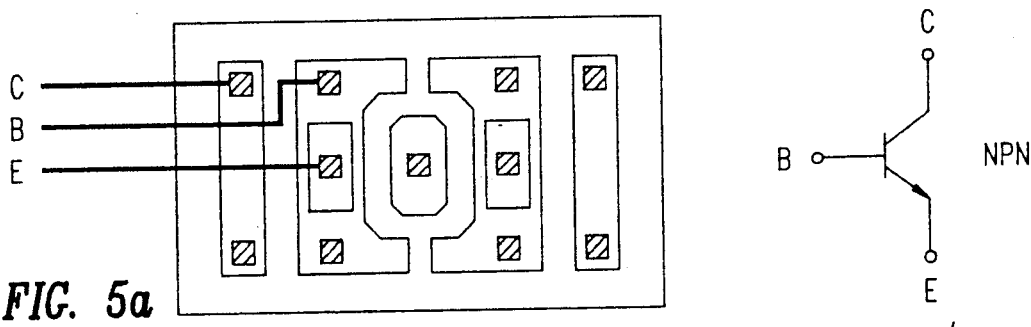
FIGS. 5a to 5l show in plan view alternative metallization patterns for use with the cell of FIG. 2 to achieve the different structures shown from this cell.

FIG. 5a illustrates certain connections to the structure depicted in plan view in FIG. 2 to form an NPN transistor. By contacting only through the contact windows 205a, 205c and 205d, collector, base and emitter regions are contacted, respectively, and an adequately performing NPN transistor is obtained.

Figure 5B:
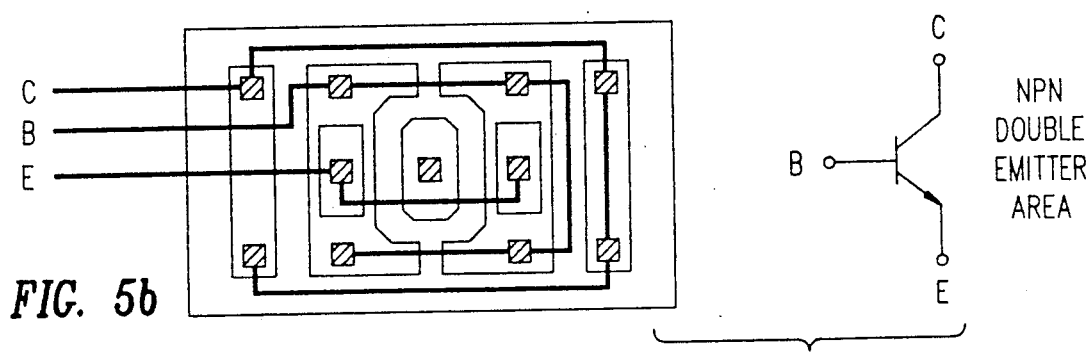

In FIG. 5b an NPN transistor is shown wherein the collector contacts are made through vias 205a, 205j, 205k and 205b, the base contacts are made through vias 205c, 205g, 205i and 205e, and the emitter contacts are made through vias 205d and 205h. The NPN transistor of FIG. 5b has twice the emitter area of the NPN transistor of FIG. 5a. In addition, there are four collector contacts rather than one collector contact and four base contacts thereby decreasing the collector and base resistances associated with this transistor compared to these resistances associated with the transistor of FIG. 5a.

Figure 5C:
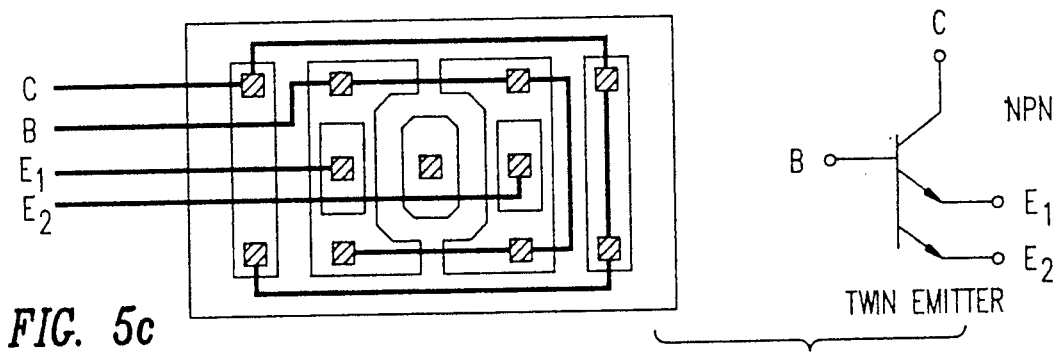

In FIG. 5c the structure is similar to that of FIG. 5b except that the contacts to the emitter region 204b and 204c through contact windows 205d and 205h are electrically separated to provide an NPN twin emitter transistor. The circuit of the twin emitter transistor is shown to the right of FIG. 5c.

Figure 5D:
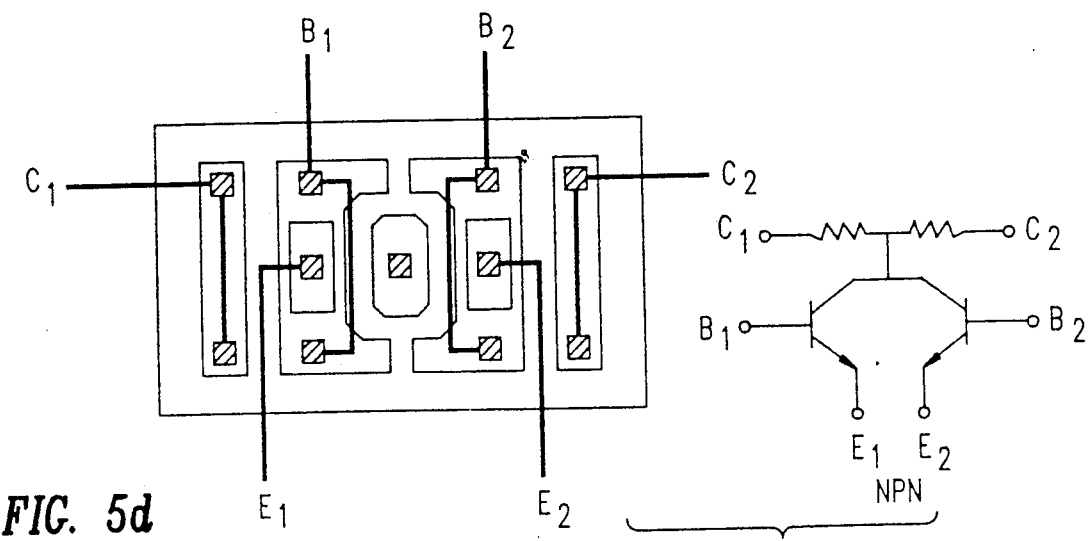

FIG. 5d illustrates the cell of FIG. 2 wherein two NPN transistors are obtained. The first NPN transistor comprises a collector with collector contact windows 205a and 205b, a base with base contact windows 205c and 205e and an emitter with an emitter contact window 205d. The second NPN transistor comprises a collector with collector contact windows 205j and 205k, base contact windows 205g and 205i, and emitter contact window 205h. Note that the collectors are common to both NPN transistors in FIG. 5d and the resistance between the collector contact C1 and collector contact C2 in the circuit diagram of FIG. 5d represents the impedance between these contacts in the common collector of the structure of FIG. 5d. Indeed, by electrically contacting collector contact C1 (through contact window 205a in FIG. 2) and collector contact C2 (through contact window 205j in FIG. 2) an electrical crossunder can be obtained using the buried layer (corresponding to region 202 in FIGS. 3a and 3b). A word is in order about the electrical contact to the N+ buried layer 202. The N+ regions 204a and 204d (shown in plan view in FIG. 2 and in cross-sectional view in FIGS. 3a and 3b) are required to provide contacts to the N epi material 210. Electrical contact to N+ buried layer 202 is obtained through N+ regions 204a and 204d and the epitaxial material between the bottom portion of 204a and 204d and the adjacent portions of N+ buried layer 202. This epitaxial material possesses an impedance but the vertical distance between buried layer 202 and the overlying N+ regions 204a and 204d is such that this impedance is relatively small. By increasing the depth of N+ regions 204a and 204d until in the limit they contact N+ buried layer 202, the impedance between contacts 206b and 206k, for example, and N+ buried layer 202 can be reduced. As a practical matter, should it be desired to make N+ regions 204a and 204d deeper, a separate mask step would be required because for reasons of performance it is desired that N+ emitter regions 204b and 204c be relatively shallow to control the base width (i.e., the width of the base region between the base-emitter and the collector-base functions). Moreover, should the regions 204b and 204c be made too deep, they will punch through the P type regions 203a and 203c in which these N type regions are formed and there will be no transistor.

Figure 5E:
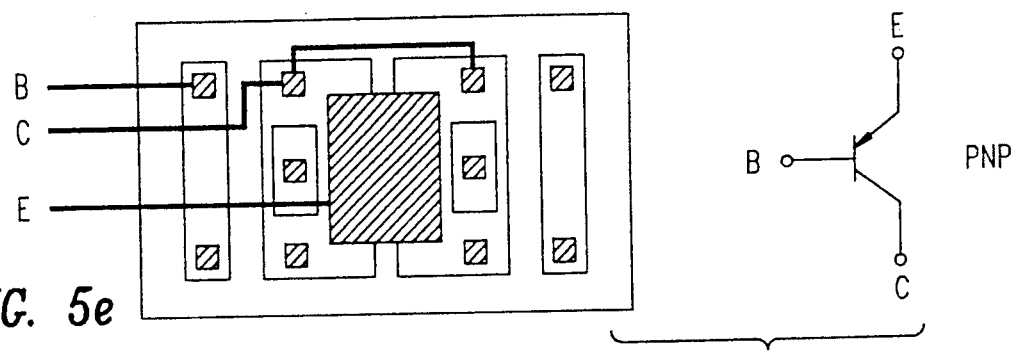

FIG. 5e illustrates a simple way to achieve a PNP transistor. The emitter contact is made to region 203b through contact via 205f with metal contact 206f. The emitter region uses a field plate to extend just about to the collector regions. Contact to the collector regions 203a and 203c is made through contact windows 205c and 205g. The base region 210d, 210e is contacted through via 205a and N+ region 204a. The resulting PNP transistor is a lateral transistor with the base region being represented by N type material 210d, 210e between the collector regions 203a and 203c. The PNP device shown in FIG. 5e could be made with only one contact to the collector (for example through collector contact window 205c alone not through collector contact window 205g). However, the performance of the lateral PNP (which is already not as good as a vertical transistor), would be further reduced relative to the performance of a vertical transistor.

Figure 5F:
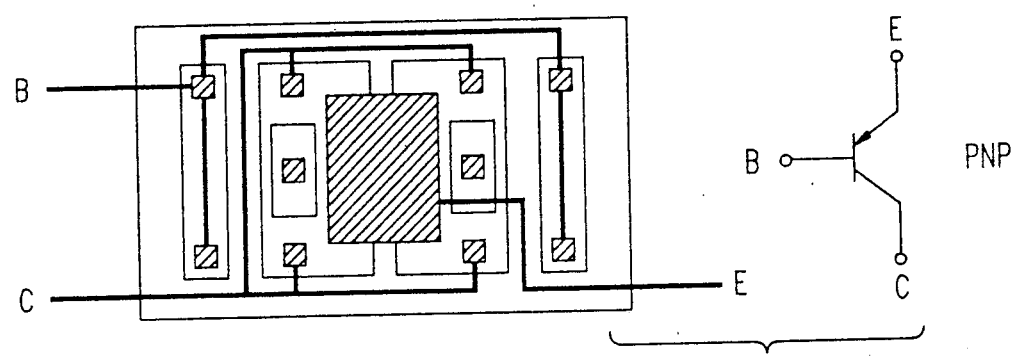

FIG. 5f illustrates a lateral PNP transistor wherein the collector contacts and the base contacts are each made through four contact windows (namely collector contact windows 205c, 205g, 205i and 205e and base contact windows 205a, 205j, 205k and 205b). Again the impedance of the device is reduced by using these additional contact windows.

Figure 5G:
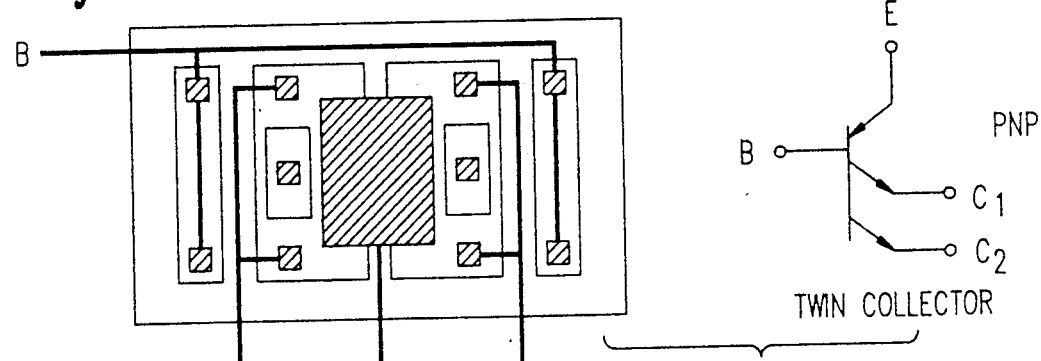

FIG. 5g illustrates a twin collector PNP wherein the separate collector regions are formed by collector contact C1 formed through contact windows 205c and 205e and by collector contact C2 formed through contact windows 205g and 205i. The resulting structure has a twin collector which is advantageous in some applications.

Figure 5H:
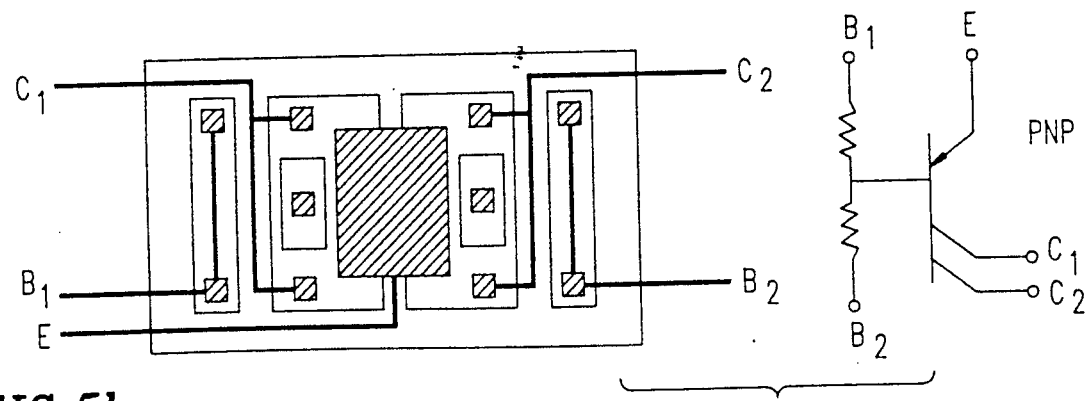

FIG. 5h illustrates the structure of FIG. 5g with an alternative connection of the base regions to provide a base crossunder structure. Thus base contact B1 extends through contact windows 205a and 205b while base contact region B2 extends through contact windows 205j and 205k. By passing a signal from base contact B1 to base contact B2 the buried layer 202 is used as a conductive path represented by the two resistors shown in the circuit diagram in FIG. 5h between base contact B1 and base contact B2.

Figure 5I:
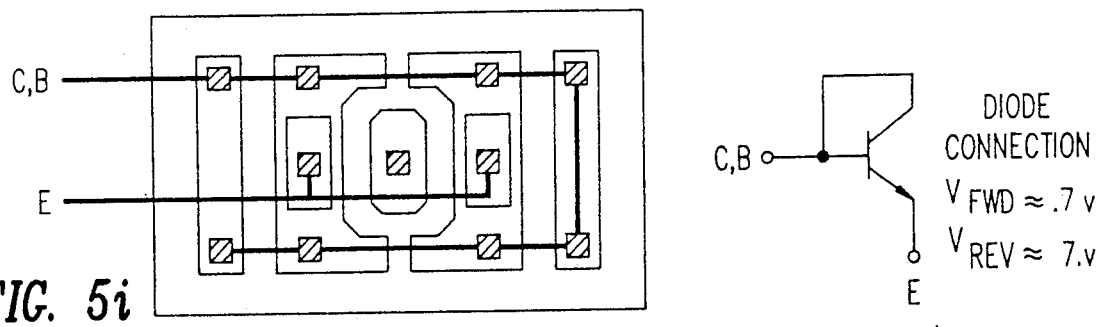

FIG. 5i illustrates a diode connection formed from the structure shown in FIG. 2. A combined collector-base contact is formed through contact windows 205a, 205c, 205g, 205j, 205k, 205i, 205e and 205b. An emitter contact is formed through contact windows 205d and 205h. The resulting structure has the circuit diagram shown to the right of FIG. 5i.

Figure 5J:
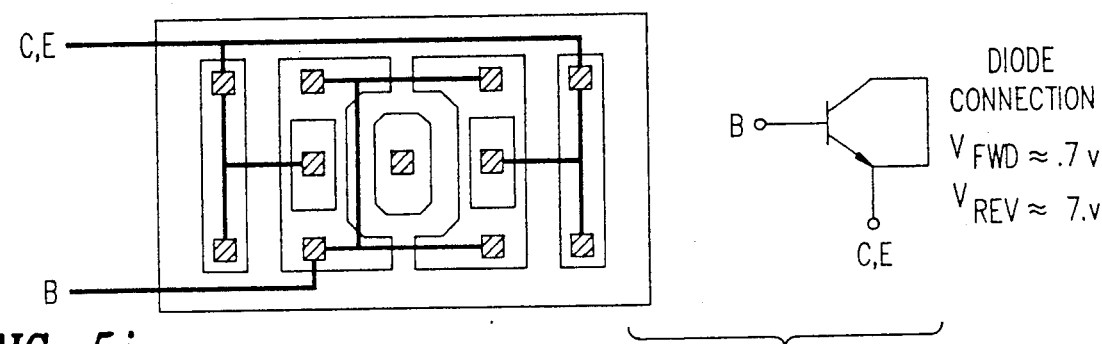

FIG. 5j shows a different diode connection where a combined collector-emitter contact is made through contact windows 205a, 205b, 205d, 205j, 205k and 205h. The base contact is then made through contact windows 205c, 205g, 205i and 205e. This structure has the circuit schematic shown to the right of FIG. 5j.

Figure 5K:
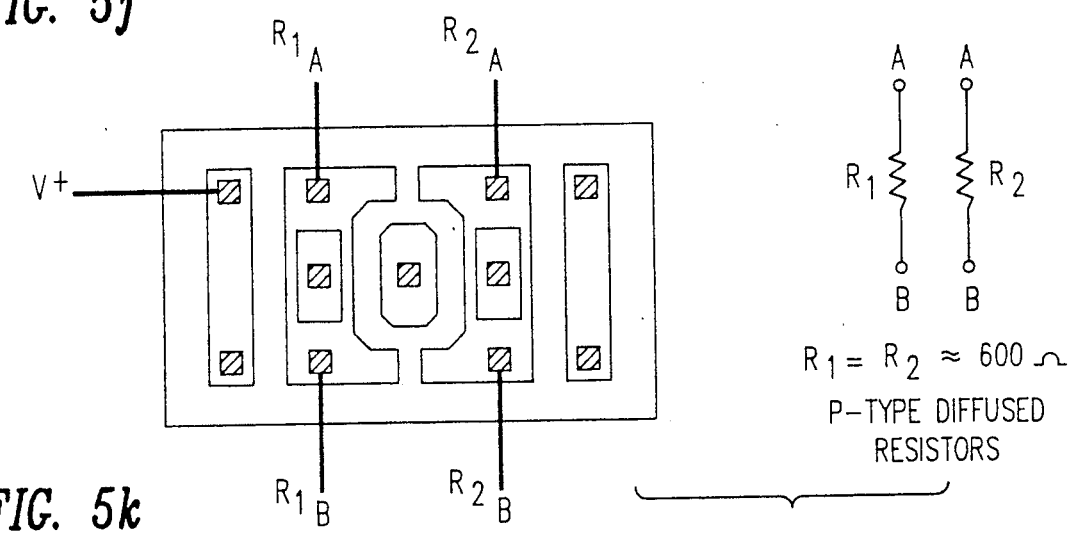

FIG. 5k illustrates two diffused resistors. The resistor R1 is formed by contacting with one lead A the region beneath contact window 205c and with a second lead B the region beneath contact window 205e. Resistor R2 is formed by contacting with a first lead A the region beneath contact window 205g and with a second lead B the region beneath contact window 205i. The resistance of these two diffused resistors depends upon the cross-sectional area and length of the current path and can be controlled during the fabrication of the cell. In this particular embodiment R1 and R2 each have a resistance of approximately 600 ohms.

Figure 5L:
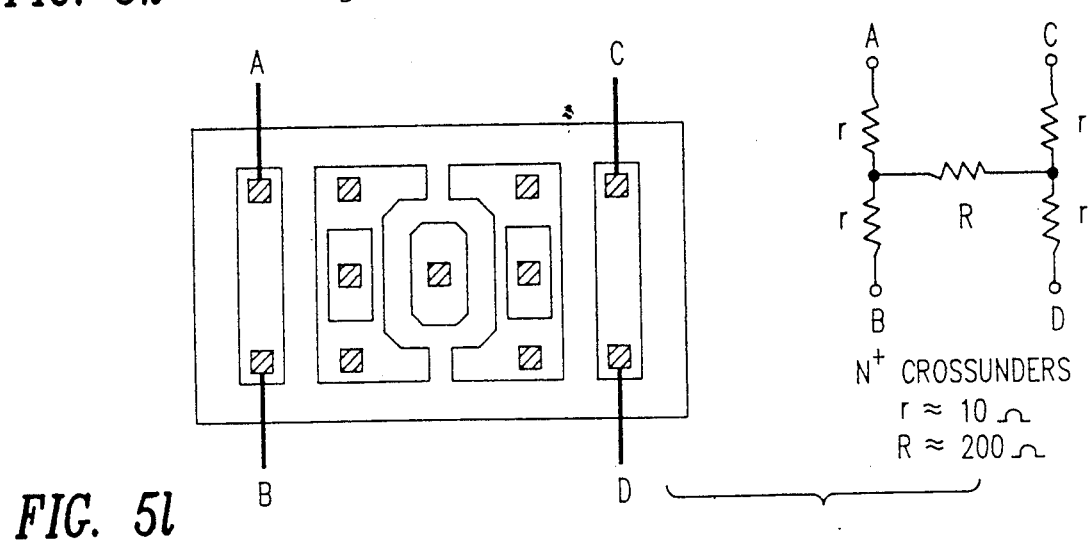

FIG. 5l illustrates the metallization pattern to form a buried crossunder from the structure shown in FIG. 2. The buried crossunder comprises N+ buried layer 202 shown in FIGS. 3a and 3b. Contact to the N+ buried layer 202 is made by means of lead A through contact window 205a, by means of lead B through contact window 205b, by means of lead C through contact window 205j and by means of lead D through contact window 205k. The impedance of the buried layer region 202 (FIGS. 3a, 3b) determines the impedance of the crossunder. The circuit for the structure achieved by the metallization pattern shown in FIG. 5l is illustrated to the right of FIG. 5l and has five resistor components. Resistance r represents half the distance along N+ region 204a and also half the distance along N+ region 204d. Resistance R represents the impedance between the center points, approximately, of N+ regions 204a and 204d through the epitaxial layer 210 and through N+ buried layer 202. Of course if A and B were tied together and C and D were tied together the impedance between the contact windows A, B and the contact windows C, D would be reduced.

Of interest, the diode structures in FIGS. 5i and 5j can, if reverse biased, be used as Zener diodes with a breakdown voltage of about 7 volts. The forward voltage of these diodes is about 0.7 volts.

It is apparent from the above description that a cell, called a merged cell because a number of different functions can be implemented using the cell either simultaneously or selectively by controlling the metallization pattern used to contact the regions of the cell, has been created which has a multiplicity of different potential uses depending upon the interconnection pattern. This cell is called a merged cell because more than one function can simultaneously, if desired, be implemented using regions within this cell. Of course, certain combinations of structures create difficulties if used simultaneously. For example, attempts to use an NPN and a PNP transistor simultaneously from this structure create a silicon-controlled rectifier type structure which might not be desired. However, the structure gives great flexibility to designers of analog devices by allowing one given cell structure replicated many times on a silicon chip to be used to create any one of a number of different analog circuits. Use of a plurality of the cells (such as shown in FIG. 2) of this invention in a chip in a uniform array allows computer-aided design systems to interconnect the cells with the desired components to form analog circuits.

Figure 6A:
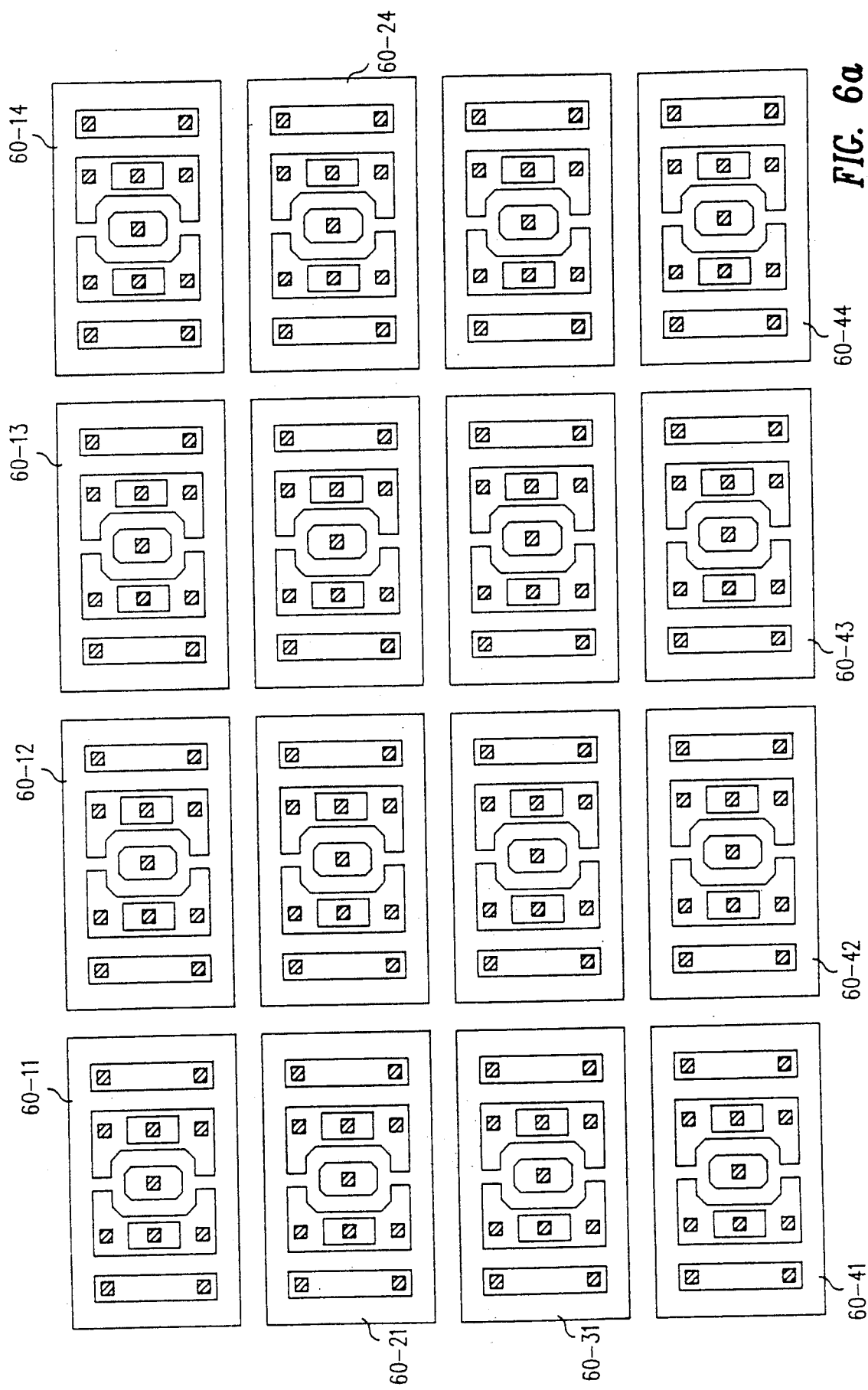
FIG. 6a shows an array of cells of the type shown in FIG. 2.
Figure 6B:
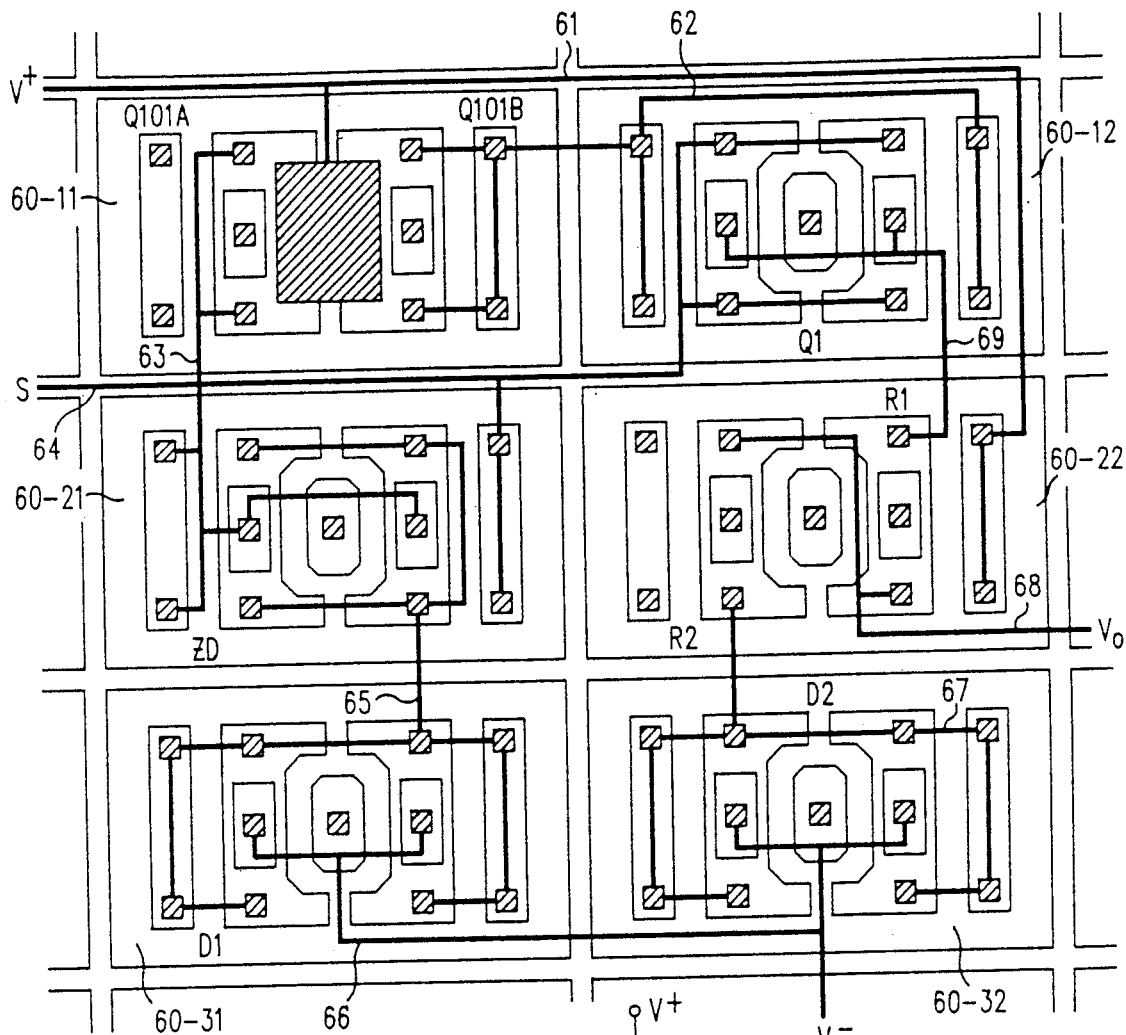
FIG. 6b shows the interconnection of the cells of the array of FIG. 6a to form the analog circuit of FIG. 6c.
Figure 6C:
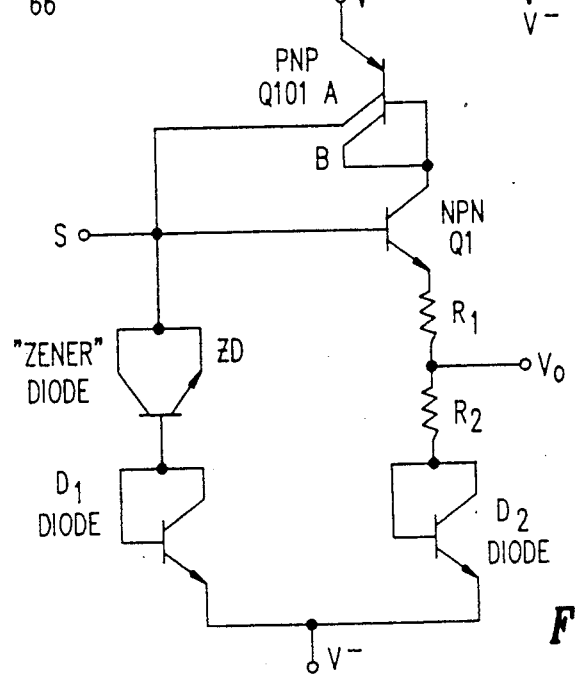
FIG. 6c shows the analog circuit (a voltage reference circuit) formed by the interconnections shown in plan view in FIG. 6b.

FIG. 6a illustrates schematically a silicon die with a plurality of the cells of FIG. 2 shown schematically having been formed in the surface and FIG. 6b shows a number of these cells interconnected schematically to perform a given function. The circuit of the structure of FIG. 6b is shown in FIG. 6c.

FIG. 6a shows an array of cells of type shown in plan view in FIG. 2. Each cell 60-MN (where M and N are each selected integers, the integer M representing the row in which the cell is located in the array and the integer N representing the column in which the cell is located in the array) is identical to the cell shown in plan view in FIG. 2. For simplicity the numbers used in FIG. 2 will not be used in FIG. 6a with respect to each cell. However, these numbers will be referred to briefly in describing certain of the connections to be made between several of the cells to form an analog circuit using the cells of this invention. As shown in FIG. 6a, the array comprises sixteen such cells. However, in general, an array on a silicon die can comprise many more such cells and M and N typically can vary between ten to twenty given available technology. Naturally, M and N will be capable of assuming whatever values are appropriate in view of the capabilities of the process technology used to fabricate the cells and the intended die size.

FIG. 6b illustrates a metallization pattern (shown by the dark lines) used to interconnect six of the cells shown in FIG. 6a into a useful analog circuit. A V+ metal contact 61 contacts the emitter contact 206f (FIG. 2) of cell 60-11 as well as the N+ buried layer contacts 206j and 206k of cell 60-22. The contact to the N+ regions in cell 60-22 through vias 205j and 205k ensures that the resistors R1 and R2 formed from this cell will be properly back biased to be isolated from the remainder of the cell. Electrical interconnect 62 connects the collector B of dual collector transistor Q101 (shown in FIG. 6c) to the base of Q101 and also to the collector of transistor Q1 located in cell 60-12 (see FIG. 6c). The collector of Q1 is contacted in cell 60-12 through connect vias 205a, 205j, 205k and 205b. The base of transistor Q101 in cell 60-11 is contacted through vias 205j and 205k and collector B of Q101 is contacted through vias 205g and 205i. The collector A of transistor Q101 is interconnected by electrical connector 63 which contacts collector A in cell 60-11 through vias 205c and 205e. In addition, electrical interconnect 63 is connected to the input lead S which contacts lead 64.

For simplicity, electrical interconnections are shown in FIG. 6b by black lines and electrical interconnection 63 and 64 are electrically connected at the crossover point. Since only one layer of metal is used to form the structure shown in FIG. 6b, the crossing of two black lines indicates that these black lines are electrically the same. Electrical interconnect 63 also contacts through vias 205a and 205b the N+ region 204a serving as the collector lead of a transistor as well as N type regions 204b and 204c (FIG. 2) serving as the emitter of a vertical NPN transistor. Because the collector and emitter are connected together, the NPN transistor in cell 60-21 functions as a reverse biased zener diode. The base of this diode is contacted by interconnect 65 through vias 205c, 205g, 205i and 205e. Interconnect 65 is also connected through vias 205c, 205i, 205e and 205a, 205j, 205k and 205b to the underlying regions in cell 60-31. These vias form the collector and base of a transistor which is to be formed as diode D1 in FIG. 6c. The zener diode formed from cell 60-21 is reverse biased to break down at approximately 7 volts. The diode D1 formed from cell 60-31 has an emitter which is contacted by interconnect 66 through vias 205d and 205h and connected by interconnects 66 to the V-power supply as well as to emitter regions 204b and 204c through vias 205d and 205h in cell 60-32. The base and collector regions of the transistor in cell 60-32 are interconnected by interconnect 67 through vias 205a, 205c, 205g, 205j, 205k, 205i, 205e and 205b to one contact of resistor R2 in cell 60-22. The interconnection of the collector and base regions of the transistor in cell 60-32 forms diode D2 from cell 60-32. Resistor R2 is formed in cell 60-22. The output voltage from the circuit $V_0$ is taken on interconnect lead 68 which contacts the P type material in region 203a through via 205c. This contact to region 203a forms the end of resistor R2 which contacts the output voltage terminal in FIG. 6c. The output terminal $V_0$ is also electrically connected to one end of resistor R1 through via 205i contacting P type region 203c in cell 60-22. The other end of resistor R1 is contacted by electrical interconnect 69 through via 205g. Electrical interconnect 69 is also connected to N type regions 204b and 204c through vias 205d and 205h. These vias comprise the emitter of NPN transistor Q1 formed from cell 60-12.

The resulting circuit shown in FIG. 6c is temperature compensated to some extent in that the reverse bias breakdown voltage of zener diode ZD responds to a given temperature change in the opposite direction as does diode D1 but with approximately the same change in voltage as diode D1. The result is to provide a circuit where the output voltage $V_0$ is approximately temperature compensated for small changes in temperature about the normal design point. The circuit shown in FIG. 6c will thus function as a voltage reference with the output voltage $V_0$ at the node between resistors R1 and R2 being approximately temperature independent. The V+ supplied to the emitter of PNP transistor Q101 can increase to higher voltages but the output voltage $V_0$ is substantially stable being clamped by the operation of zener diode ZD and diode D1.

FIGS. 7a through 7g illustrate various devices which can be fabricated by changing the interconnect pattern using the cell of FIG. 1c.

Figure 7A:
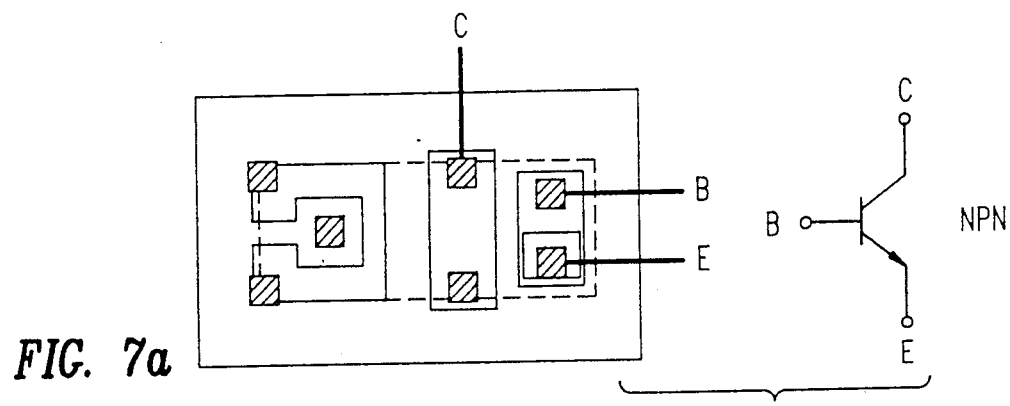
FIGS. 7a to 7g show in plan view alternative metallization patterns for use with the cell of FIG. 1c to achieve the different structures shown from this cell.

FIG. 7a shows an NPN transistor which is formed by making a collector contact through via 31b to the N+ region 31a of the cell in FIG. 1c and by making a base contact through via 32a to P type base region 32 of the cell shown in FIG. 1c and by making the emitter contact through via 33a to the N+ region 33 of the cell shown in FIG. 1c.

Figure 7B:
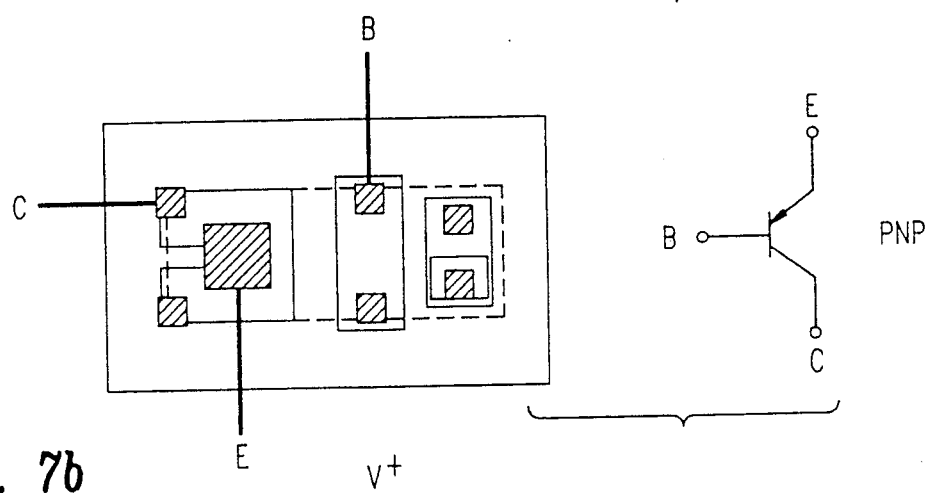

A PNP transistor is shown in FIG. 7b formed from the same cell. In FIG. 7b, the base contact is through via 31b to N+ region 31a, the collector contact is through via 35a to P type region 34a and the emitter contact is through via 36a to P type region 36.

Figure 7C:
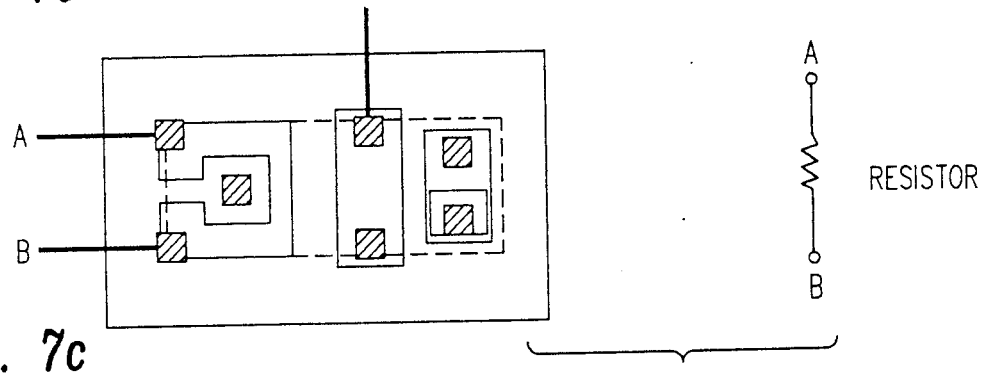

FIG. 7c illustrates a resistor formed between terminals A and B from the P type material 34a, 34b and 34c illustrated in plan view in the cell of FIG. 1c. Terminal A contacts P type material 34a through via 35a while the terminal B contacts P type material 34b through via 35b. A V+ voltage is applied to the N type semiconductor material underlying and between P type regions 34a, 34b, 34c and 36 by connecting an electrical lead through via 31b to N type material 31a and the underlying N type material 37 of N epi pocket 31.

Figure 7D:
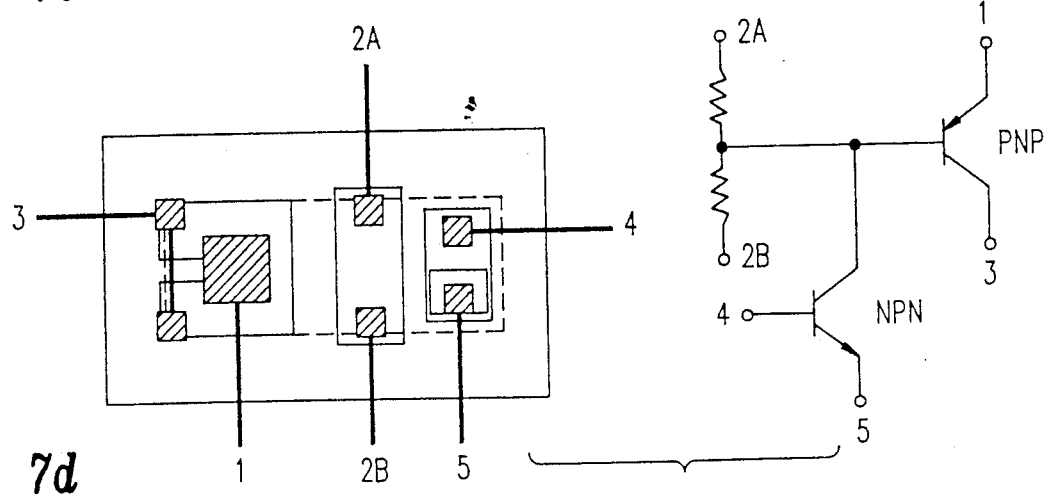

FIG. 7d illustrates a more complex structure including an NPN transistor, a PNP transistor and a resistive crossunder between terminals 2A and 2B. As illustrated in FIG. 7d, the emitter of the PNP transistor is formed by an electrical contact through via 36a to P type material 36. The base contact to this PNP transistor is formed through two terminals 2A and 2B contacting through vias 31b and 31c N+ material 31a and through a pocket 31 an underlying buried layer (comparable to buried layer 202 shown in FIGS. 3a, 3b with respect to the structure shown in FIG. 2 but not shown in any cross-section in the drawings with respect to FIG. 1c). This underlying buried layer extends under the P type regions 34a, 34b and 34c and provides electrical contact to N type material 37 which is both laterally surrounding and beneath P type region 36.

The two resistors are formed by the N+ material between via 31b and via 31c above N type region 31a. The base region of the NPN transistor is formed by an electrical contact through via 32a to P type region 32 while the emitter contact of the NPN transistor is formed through via 33a to region 33. The collector of the NPN transistor is connected to the base of the PNP transistor through the common N type material 37, 38 and 31a. Of course, beneath all of the regions shown in plan view in FIG. 1c within N epi pocket 31 is an N+ buried layer to provide low resistance contact to various regions beneath the regions shown in plan view in FIG. 1c. The dotted line 39 in FIG. 1c illustrates the lateral boundary of this buried layer.

Figure 7E:
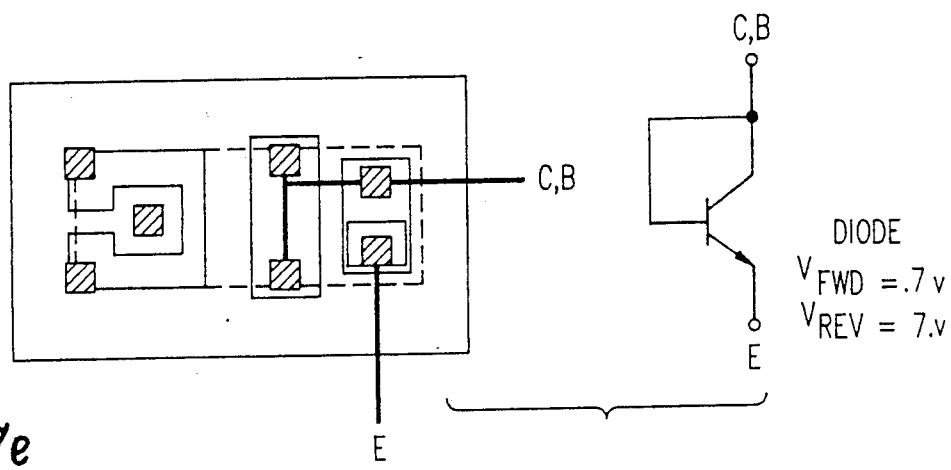

FIG. 7e illustrates a diode formed from the cell of FIG. 1c. The diode is formed from the transistor structure by connecting the collector and base by means of one electrical interconnection contacting region 32 through via 32a and contacting region 31a through vias 31b and 31c. The emitter region is contacted through via 33a to pocket 33. The resulting diode has a forward bias voltage of about 0.7 volts and a reverse bias voltage of 7 volts.

Figure 7F:
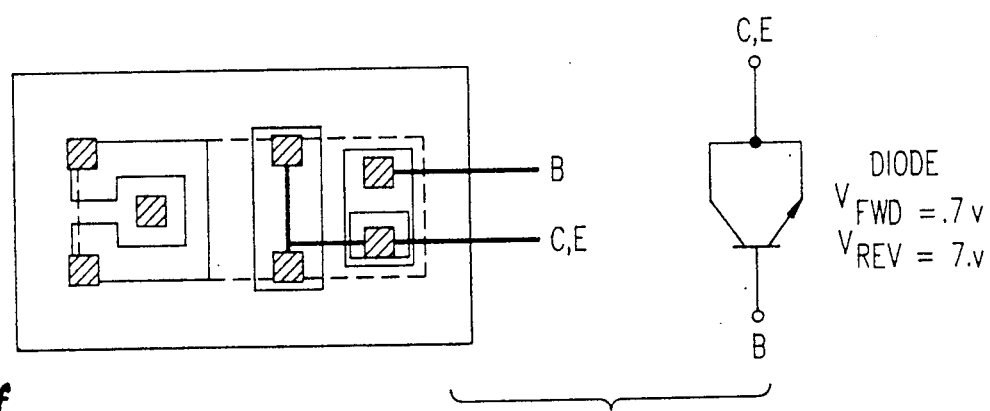

FIG. 7f illustrates a reverse biased zener diode. The collector and emitter of the transistor structure are connected together to form the one terminal to the diode by means of an electrical interconnection which contacts N+ region 33 through via 33a and which contacts N+ region 31a corresponding to the collector and emitter of a transistor through vias 31b and 31c. The base which serves as one terminal of the diode is contacted through via 32a to P type material 32. The diode shown in FIG. 7f functions as a zener diode with a forward bias voltage of about 0.7 volts and a reverse bias voltage of about 7 volts.

Figure 7G:
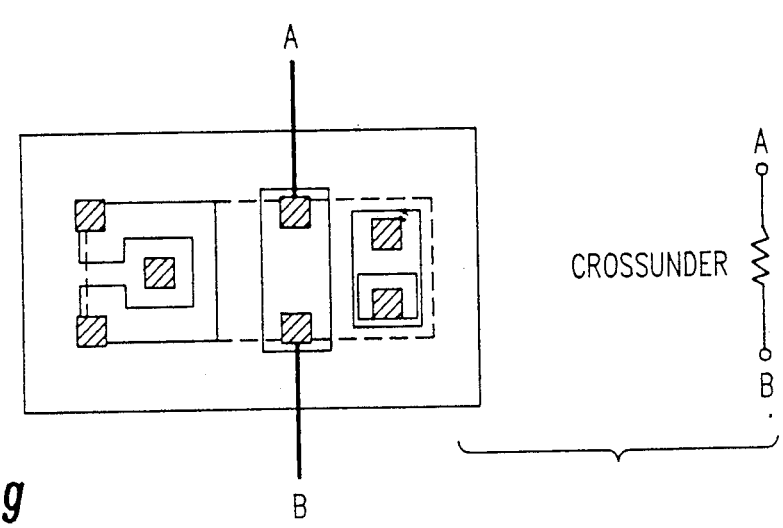

FIG. 7g illustrates a crossunder formed using the structure of this invention. The crossunder is formed using N+ region 31a. One terminal contacts region 31a through via 31b and the other terminal contacts region 31a through via 31c.

Naturally, other structures can be formed from the cell shown in FIG. 1c and the structures formed in FIGS. 7a through 7g are merely illustrative.

Two types of crossunders are possible with this invention. Looking now at FIG. 2, a crossunder is formed from region 204a by having one contact to region 204a through via 205a and by having the other contact to region 204a through via 205b. However, a buried crossunder occurs when the electrical current passes through a region separated from the surface of the semiconductor device by at least one other region of semiconductor material. When the crossunder consists of N+ buried layer 202 contacted, for example, through vias 205b and 205a on the one hand, and through vias 205j and 205k on the other hand, this crossunder would be a buried crossunder because it passes beneath P type diffused regions 203a and 203c.

A word is in order about an important difference between the cell shown in FIG. 1c and the cell shown in FIG. 2. The cell of FIG. 2 is symmetric about both an X axis through its center and a Y axis through its center. This allows the patterns formed in each cell to be reversed The resulting flexibility allows circuits to be formed in different directions across an array without any change in performance. The cell of FIG. 1c lacks this symmetry and thus this flexibility. The symmetry achievable with the cell of FIG. 2 allows various mirror images of the layouts shown in FIG. 6b, for example, to be used to achieve the same circuit shown in FIG. 6c. This is extremely useful if the V+ and V- supply voltages are available in different locations on the array. The symmetry particularly facilitates the interconnection of various building blocks. The price of this is to sacrifice some density using the cell of FIG. 2 compared to the density achievable using the cell of FIG. 1c.

While several embodiments of this invention have been described above, other embodiments of this invention will be obvious to those skilled in the art from the above description. For example, structures with conductivity types opposite to those shown in the FIGS. can be used to fabricate analog circuits in accordance with the principles of this invention.

I claim:

1. A semiconductor cell structure suitable for formation of any one electrical component selected from the group of components consisting of (i) a PNP transistor, (ii) an NPN transistor, (iii) a diode, (iv) a resistor, and (v) a crossunder, comprising:
    semiconductor material of a first conductivity type and having a surface;
    a semiconductor pocket of a second conductivity type opposite to said first conductivity type formed in said semiconductor material, said semiconductor pocket having a surface coincident with said surface of said semiconductor material;
    at least two regions of first conductivity type formed laterally spaced from each other in said semiconductor pocket;
    at least one region of said second conductivity type formed in one of said at least two regions of first conductivity type; and
    a conductive layer overlying but insulated from said semiconductor pocket, said conductive layer being electrically connected to said semiconductor pocket, to said at least two regions of first conductivity, and to said at least one region of second conductivity wherein said conductive layer is selectively removed to leave portions of said conductive layer electrically interconnecting selected ones of said pocket and said regions to thereby form one of said electrical components.

2. A semiconductor cell structure as in claim 1 including:
    a buried layer extending under all of said at least two regions; and
    means for contacting said buried layer.

3. A semiconductor cell structure as in claim 2 wherein said means for contacting said buried layer comprises a region of said second conductivity type but of higher conductivity than said semiconductor pocket extending from said surface toward said buried layer.

4. A semiconductor cell structure as in claim 1 wherein said first conductivity type is P type and said second conductivity type is N type.

5. A semiconductor cell structure as in claim 1 wherein one of said at least two regions of said first conductivity type is formed in an elongated shape thereby to allow contact to be made to two separate portions of said region to form from said region a resistor.

6. A semiconductor cell structure as in claim 1 wherein said conductive layer is selectively removed so as to form an NPN transistor.

7. A semiconductor cell structure as in claim 1 wherein said conductive layer is selectively removed so as to form a PNP transistor.

8. A semiconductor cell structure as in claim 1 wherein said conductive layer is selectively removed so as to form a resistor.

9. A semiconductor cell structure as in claim 1 wherein said conductive layer is selectively removed so as to form a diode.

10. A semiconductor cell structure as in claim 1 comprising a crossunder.

11. A semiconductor cell structure as in claim 10 wherein said crossunder comprises a buried crossunder.

12. A semiconductor cell structure for formation into one component selected from the group of components consisting of a first bipolar transistor, having an emitter and a collector with a selected conductivity, a second bipolar transistor, having an emitter and a collector formed with a conductivity opposite to said selected conductivity, a resistor and a diode comprising:
    semiconductor material of a first conductivity type;
    a first region of a second conductivity type opposite to said first conductivity type formed in said semiconductor material;
    a second region of said first conductivity type formed within said first region;
    a third region of said second conductivity type formed in said second region;
    a fourth region of said first conductivity type formed in said first region laterally spaced from said second region;
    a fifth region of said first conductivity type formed in said first region adjacent to, but not in contact with, said fourth region; and
    a conductive layer overlying but insulated from said semiconductor material, said conductive layer being electrically connected to said first, second, third, fourth and fifth regions wherein:
    said second bipolar transistor is formed by opening said electrical connection from said conductive layer to said second region and said third region; and
    said first bipolar transistor is formed by opening said electrical connection from said conductive layer to said fourth region and said fifth region.

13. A semiconductor cell structure as in claim 12 wherein said first bipolar transistor is an NPN transistor, wherein said first region comprises the collector, said second region comprises the base and said third region comprises the emitter of said NPN transistor and said second bipolar transistor is a PNP transistor wherein said fourth region comprises the emitter, said fifth region comprises the collector and said first region comprises the base of said PNP transistor.

14. A semiconductor cell structure as in claim 13 wherein said NPN transistor is a vertical transistor.

15. A semiconductor cell structure as in claim 13 wherein said PNP transistor is a lateral transistor.

16. A semiconductor cell structure as in claim 13 including:
a buried layer underlying said second region, said fourth region, and said fifth region.

17. A semiconductor die comprising a plurality of semiconductor cell structures wherein each semiconductor cell structure of said plurality is a semiconductor cell structure as set forth in claim 12.

18. A semiconductor die as in claim 17 including means for interconnecting said plurality of semiconductor cell structures to form an analog circuit.

19. A semiconductor cell structure as in claim 12 including a sixth region of second conductivity type formed in said fifth region.

20. A semiconductor cell structure as in claim 19 wherein said second region of first conductivity type and said fifth region of first conductivity type are laterally spaced from each other in said first region of second conductivity type and wherein said fourth region of first conductivity type is placed between said second region and said fifth region but laterally spaced from each.

21. A semiconductor cell structure as in claim 20 wherein said conductive layer overlying but insulated from said semiconductor material is electrically connected to said sixth region.

22. A semiconductor cell structure as in claim 21 wherein said electrical connection from said conductive layer to said second region comprises at least two electrical contacts to separate portions of said second region.

23. A semiconductor cell structure as in claim 22 wherein said electrical connection from said conductive layer to said fifth region comprises at least two electrical contacts to separate portions of said fifth region.

24. A semiconductor cell structure as in claim 22 wherein said second region and said fifth region each function as a resistive element when said electrical connections from said conductive layer to said third, fourth and sixth regions are opened.

25. A semiconductor cell structure as in claim 23 wherein said second region and said fifth region each function as a resistive element when said electrical connections from said conductive layer to said third, fourth and sixth regions are opened.

26. A semiconductor cell structure as in claim 20 including a buried layer of second conductivity type but of a higher conductivity than the conductivity of said first region, formed at the interface between said first region and said semiconductor material so as to extend partly into said semiconductor material and partly into said first region; and
means for electrically contacting said buried layer comprising:
a seventh region of said second conductivity type but of a higher conductivity than the conductivity of said first region and an eighth region of said second conductivity type but of a higher conductivity than said first region both said seventh and eighth regions being formed at the surface of said first region and extending into said first region toward said buried layer.

27. A semiconductor cell structure as in claim 26 including:
means for making electrical contact to said seventh region; and
means for making electrical contact to said eighth region.

28. A semiconductor cell structure as in claim 27 wherein
said means for making electrical contact to said seventh region comprises at least two vias through insulation overlying said seventh region by which electrical contact is made to two separate portions of said seventh region such that the material between said two portions comprises a resistive element; and
said means for making electrical contact to said eighth region comprises at least two vias through insulation overlying said eighth region by which electrical contact is made to two separate portions of said eighth region such that the material between said two portions comprises a resistive element.

29. A semiconductor cell structure as in claim 26 wherein said seventh region is adjacent to but laterally spaced from said fifth region and said eighth region is adjacent to but laterally spaced from said second region.

30. A semiconductor cell structure as in claim 29 wherein said second region and said fifth region are located symetrically opposite but laterally spaced from said fourth region, said seventh region is adjacent to but laterally spaced from said fifth region and said eighth region is adjacent to but laterally spaced from said second region such that said second, third, fourth, fifth, sixth, seventh and eighth regions are symetrically located about X and Y axes of said structure.

31. A semiconductor structure comprising:
a plurality of universal cell structures; and
a conductive layer, electrically connected to each cell in said plurality of universal cell structures, overlying but insulated from said plurality of universal cell structures wherein each universal cell structure further comprises:
semiconductor material of a first conductivity type having a surface;
a semiconductor pocket of a second conductivity type opposite to said first conductivity type formed in said semiconductor material, said semiconductor pocket having a surface coincident with said surface of said semiconductor material;
at least two regions of first conductivity type formed laterally spaced from each other in said semiconductor pocket wherein one of said two regions of said first conductivity type is formed in an elongated shape thereby to allow contact to be made to two separate portions of said region;
at least one region of said second conductivity type formed in one of said at least two regions of first conductivity type;
a buried layer of second conductivity type extending under all of said at least two regions; and
means for contacting said buried layer wherein said means for contacting said buried layer comprises a region of said second conductivity type but of higher conductivity than said semiconductor pocket extending from said surface toward said buried layer;

wherein said electrical connection of said conductive layer to each cell in said plurality of universal cell structures comprises said conductive layer being electrically connected to said semiconductor pocket, to said at least two regions of first conductivity and to said at least one region of second conductivity of each of said plurality of universal cell structures;

said conductive layer is removed from selected universal cell structures in said array so that each of said selected universal cell structures forms one component from the group of components consisting of (i) an NPN transistor, (ii) a PNP transistor, (iii) a resistor, (iv) a diode, (v) a crossunder, (vi) a buried crossunder, and (vii) combinations of these elements; and said conductive layer is removed so that said selected universal cell structures form an analog circuit.

32. A semiconductor cell structure as in claim 31 wherein said first conductivity type is P type and said second conductivity type is N type.

33. A semiconductor cell structure for formation into one component from the group of components consisting of a first bipolar transistor, having an emitter and a collector with a selected conductivity, a second bipolar transistor, having an emitter and a collector formed with a conductivity opposite to said selected conductivity, and a diode, comprising:

semiconductor material of a first conductivity type;

a first region of a second conductivity type opposite to said first conductivity type formed in said semiconductor material;

a second region of said first conductivity type formed within said first region;

a third region of said second conductivity type formed in said second region;

a fourth region of said first conductivity type formed in said first region laterally spaced from said second region;

a fifth region of said first conductivity type formed in said first region adjacent to, but not in contact with, said fourth region; and a conductive layer overlying but insulated from said semiconductor material, said conductive layer being electrically connected to said first, second, third, fourth and fifth regions; wherein:

said second bipolar transistor is formed by opening said electrical connection from said conductive layer to said second region and said third region; and said first bipolar transistor is formed by opening said electrical connection from said conductive layer to said fourth region and said fifth region.

* * * * *